(12) United States Patent
Zhang et al.

(10) Patent No.: US 12,107,608 B2
(45) Date of Patent: Oct. 1, 2024

(54) SIGNAL DISTORTION PRE-CORRECTION METHOD, DEVICE AND NON-VOLATILE STORAGE MEDIUM

(71) Applicant: ZTE CORPORATION, Shenzhen (CN)

(72) Inventors: Zheyuan Zhang, Shenzhen (CN); Dongfang Ning, Shenzhen (CN); Songkun Chen, Shenzhen (CN); Yanru Cao, Shenzhen (CN); Zhengjian Dai, Shenzhen (CN); Guangyu Hu, Shenzhen (CN); Zuofeng Zhang, Shenzhen (CN)

(73) Assignee: ZTE CORPORATION, Shenzhen (CN)

(*) Notice: Subject to any disclaimer, the term of this patent is extended or adjusted under 35 U.S.C. 154(b) by 0 days.

(21) Appl. No.: 18/003,557

(22) PCT Filed: Jun. 22, 2021

(86) PCT No.: PCT/CN2021/101650
§ 371 (c)(1),
(2) Date: Dec. 28, 2022

(87) PCT Pub. No.: WO2022/001763
PCT Pub. Date: Jan. 6, 2022

(65) Prior Publication Data
US 2023/0275605 A1   Aug. 31, 2023

(30) Foreign Application Priority Data
Jun. 28, 2020   (CN) .......................... 202010604882.8

(51) Int. Cl.
*H04B 1/04* (2006.01)
(52) U.S. Cl.
CPC ................. *H04B 1/0475* (2013.01)

(58) Field of Classification Search
CPC .. H04B 1/0475; H04B 7/0417; H04B 7/0456; H04B 7/0413; H04B 7/0617;
(Continued)

(56) References Cited

U.S. PATENT DOCUMENTS 9,577,588 B1 * 2/2017 Beidas ..................... H03F 3/211
2012/0328050 A1 * 12/2012 Bai ........................... H03F 3/195
455/114.3

(Continued)

FOREIGN PATENT DOCUMENTS

| CN | 108833318 A | 11/2018 |
| CN | 109155637 A | 1/2019 |
| WO | 2019145026 A1 | 8/2019 |

OTHER PUBLICATIONS

International Search Report and Written Opinion issued in International Patent Application No. PCT/CN2021/101650; mailed Sep. 24, 2021; 11 pgs.

(Continued)

*Primary Examiner* — Emmanuel Bayard
(74) *Attorney, Agent, or Firm* — HAUPTMAN HAM, LLP (57) ABSTRACT

The embodiments of the present application relate to the field of communications, and provide a signal distortion pre-correction method, a signal distortion pre-correction device, and a non-volatile storage medium. In the present application, the mutual coupling filtering parameters and the predistortion coefficient candidate set are obtained by training the feedback signal collected by the multi-channel coupling element, so that the mutual coupling filtering processing can be performed on the forward signal of the digital channel according to the obtained mutual coupling filtering parameter, to make the target predistortion coefficient selected in the predistortion coefficient candidate set according to the forward signal after mutual coupling fil- (Continued)

tering and the forward signal of the digital channel to be processed to be the predistortion coefficient considering the mutual coupling factor of the digital channel.

10 Claims, 7 Drawing Sheets (58) Field of Classification Search
CPC ............ H04L 25/0204; H04L 25/0224; H04L 25/03343; H04L 25/49
USPC ................................................. 375/295–297
See application file for complete search history.

(56) References Cited

U.S. PATENT DOCUMENTS

| 2013/0052964 | A1  | 2/2013  | Husted                   |
|--------------|-----|---------|--------------------------|
| 2015/0358922 | A1* | 12/2015 | Xiong ............ H04L 25/03343 375/297 |
| 2016/0241277 | A1* | 8/2016  | Rexberg ................. H03F 3/24 |
| 2017/0257251 | A1* | 9/2017  | Zhao ................... H03F 1/3247 |
| 2018/0167092 | A1* | 6/2018  | Hausmair ......... H04L 25/03343 |
| 2019/0068429 | A1  | 2/2019  | Sagi et al.              |
| 2019/0089389 | A1  | 3/2019  | Gutman et al.            |
| 2020/0186103 | A1* | 6/2020  | Weber .................. H04L 27/368 |
| 2021/0367564 | A1* | 11/2021 | Hausmair ............... H03F 3/189 |
| 2022/0021349 | A1* | 1/2022  | Yan ......................... H04B 1/62 |

OTHER PUBLICATIONS

Wang, Xiaoyu et al; "Digital Predistortion of 5G Massive MIMO Wireless Transmitters Based on Indirect Identification of Power Amplifier Behavior With OTA Tests", IEEE Transactions on Microwave Theory and Techniques, vol. 68, No. 1, Jan. 31, 2020, 14 pgs.
Communication of and extended European Search Report issued in European Patent Application No. 21832979.5; mailed Jun. 18, 2024; 10 pgs.
Bassam, Seyed Aidin, et al.; "Crossover Digital Predistorter for the Compensation of Crosstalk and Nonlinearity in MIMO Transmitters"; IEEE Transactions on Microwave Theory and Techniques, vol. 57, No. 5, May 2009; pp. 1119-1128.

* cited by examiner

SIGNAL DISTORTION PRE-CORRECTION METHOD, DEVICE AND NON-VOLATILE STORAGE MEDIUM

CROSS-REFERENCE TO RELATED APPLICATIONS

This application is the National Stage of International Application No. PCT/CN2021/101650, filed on Jun. 22, 2021, which claims priority to Chinese Patent Application No. 202010604882.8, filed on Jun. 28, 2020, the entire contents of which are incorporated herein by reference.

TECHNICAL FIELD

The embodiments of the present application relate to the field of communications, and in particular, to a signal distortion pre-correction method, a signal distortion pre-correction device, and a non-volatile storage medium.

BACKGROUND

In modern mobile communication systems, multi-carrier transmission technology and high-order digital modulation methods lead to higher peak-to-average ratios and larger signal transmission bandwidths. When the power amplifier (PA) works in the near-saturation region, it will cause serious nonlinear distortion in the PA. In this case, digital pre-distortion (DPD) technology emerges as the times require, and has become the preferred method for pre-correcting nonlinear system distortion due to its advantages of low cost and obvious distortion improvement effect.

However, in 5G millimeter wave communication, in order to obtain larger system capacity, higher spectrum utilization and higher beamforming gain, massive multiple in multiple out (massive MIMO) technology and analog beamforming technology are usually adopted. Using the analog beamforming technology, that is, the existing MIMO beamforming system, there is a problem that one digital channel is connected with multiple analog radio frequency channels. In this case, if the distortion technology is used, a predistorter needs to be designed to correct the nonlinear distortion of multiple PAs simultaneously. However, in this MIMO beamforming system, since there is no circulator between the PA and the antenna element, the coupling interference between the digital channels has a great impact on the characteristics of the power amplifier, which in turn affects the performance advantages of the MIMO beamforming system.

SUMMARY

The purpose of the embodiments of the present application is to provide a signal distortion pre-correction method, a signal distortion pre-correction device and a non-volatile storage medium, which aims to eliminate the coupling interference between digital channels, so as to minimize the impact on the characteristics of the power amplifier, so that the performance advantages of the MIMO beamforming system can be exerted.

In order to address the above technical problem, the embodiments of the present application provide a signal distortion pre-correction method, including: performing mutual coupling filtering processing on a forward signal of each digital channel according to a mutual coupling filter parameter, the mutual coupling filter parameter is obtained by training a feedback signal collected by a multi-channel coupling element; selecting a target predistortion coefficient from a predistortion coefficient candidate set according to a forward signal of a digital channel to be processed and the forward signal of each digital channel after the mutual coupling filtering, the predistortion coefficient candidate set is obtained by training the feedback signal collected by the multi-channel coupling element; and performing distortion pre-compensation processing on the forward signal of the digital channel to be processed according to the target predistortion coefficient.

The embodiments of the present application further provide a signal distortion pre-correction device, including: a coupling signal feedback control module, a predistortion learning module, a mutual coupling filter module and a predistortion module, the coupling signal feedback control module is connected to the predistortion learning module, the predistortion learning module is respectively connected to the mutual coupling filter module and the predistortion module, and the mutual coupling filter module is connected to the predistortion module; the coupling signal feedback control module is configured to obtain a feedback signal collected by a multi-channel coupling element, and transmit the feedback signal to the predistortion learning module; the predistortion learning module is configured to obtain a mutual coupling filter parameter and a predistortion coefficient candidate set through training the feedback signal collected by the multi-channel coupling element, transmit the mutual coupling filter parameter to the mutual coupling filter module, and transmit the predistortion coefficient candidate set to the predistortion module; the mutual coupling filter module is configured to perform mutual coupling filtering processing on the forward signal of the digital channel according to the mutual coupling filter parameter, and transmit the forward signal of the digital channel after the mutual coupling filtering to the predistortion module; the predistortion module is configured to select a target predistortion coefficient from the predistortion coefficient candidate set according to the forward signal of the digital channel to be processed and the forward signal of the digital channel after the mutual coupling filtering, and perform distortion pre-compensation processing on the forward signal of the digital channel to be processed according to the target predistortion coefficient.

The embodiments of the present application further provide a non-volatile storage medium for storing a computer-readable program, and the computer-readable program is used for a computer to execute the signal distortion pre-correction method as described above.

BRIEF DESCRIPTION OF THE DRAWINGS

One or more embodiments are exemplified by the pictures in the corresponding drawings, and these exemplified descriptions do not constitute limitations on the embodiments.

DETAILED DESCRIPTION OF THE EMBODIMENTS

In order to make the objectives, technical solutions and advantages of the embodiments of the present application clearer, each embodiment of the present application will be described in detail below with reference to the accompanying drawings. However, those of ordinary skill in the art can understand that, in each embodiment of the present application, many technical details are provided for readers to better understand the present application. However, even without these technical details and various changes and modifications based on the following embodiments, the technical solutions claimed in the present application can be realized. The following divisions of the various embodiments are for the convenience of description, and should not constitute any limitation on the specific implementation manner of the present application, and the various embodiments may be combined with each other and referred to each other on the premise of not contradicting each other.

A first embodiment of the present application relates to a signal distortion pre-correction method, including: performing mutual coupling filtering processing on a forward signal of each digital channel according to a mutual coupling filter parameter, the mutual coupling filter parameter is obtained by training feedback signal collected by the multi-channel coupling element; selecting a target predistortion coefficient from a predistortion coefficient candidate set according to a forward signal of a digital channel to be processed, and the forward signal of each digital channel after the mutual coupling filtering, the predistortion coefficient candidate set is obtained by training the feedback signal collected by the multi-channel coupling element; and performing distortion pre-compensation processing on the forward signal of the digital channel to be processed according to the target predistortion coefficient. The mutual coupling filter parameters and the predistortion coefficient candidate set are obtained by training the feedback signal collected by the multi-channel coupling element, so that the mutual coupling filtering processing can be performed on the forward signal of the digital channel according to the obtained mutual coupling filter parameter, to make the target predistortion coefficient selected in the predistortion coefficient candidate set according to the forward signal after mutual coupling filtering and the forward signal of the digital channel to be processed to be the predistortion coefficient considering the mutual coupling factor of the digital channel. Further, the distortion pre-compensation processing performed on the forward signal of the digital channel to be processed according to the target pre-distortion coefficient can reduce the influence on the characteristics of the power amplifier as much as possible, and greatly improve the accuracy of signal distortion pre-correction, so that the performance advantages of the MIMO beamforming system can be better exerted.

The implementation details of the signal distortion pre-correction method in this embodiment will be described below. The following contents are only implementation details provided for the convenience of understanding, and are not necessary for implementing this solution.

In this embodiment, the signal distortion pre-correction method is applied to the DPD architecture of a MIMO scenario (also called: MIMO beamforming system), and in order to ensure the realization of the signal distortion pre-correction method in this embodiment, the structure of the existing MIMO beamforming system needs to be adaptively adjusted. Specifically, under the condition of ensuring each component in the existing MIMO beamforming system, a corresponding number of mutual coupling filter modules, predistortion learners, and coupling signal feedback controllers are added according to the number of digital channels. That is, each digital channel corresponds to a mutual coupling filter module, a predistortion learner, and a coupling signal feedback controller.

In addition, the multi-channel coupling element involved in the signal distortion pre-correction method in this embodiment may be performed by using several antenna elements in the antenna array element that meet the requirements. That is, the multi-channel coupling element is located in the antenna array, such as in the radome of the whole machine, as shown in FIG. 1; can also be provided separately outside the array of the antenna array element, for example, provided on the antenna substrate at the near-field position outside the antenna, as shown in FIG. 2.

Figure 1:
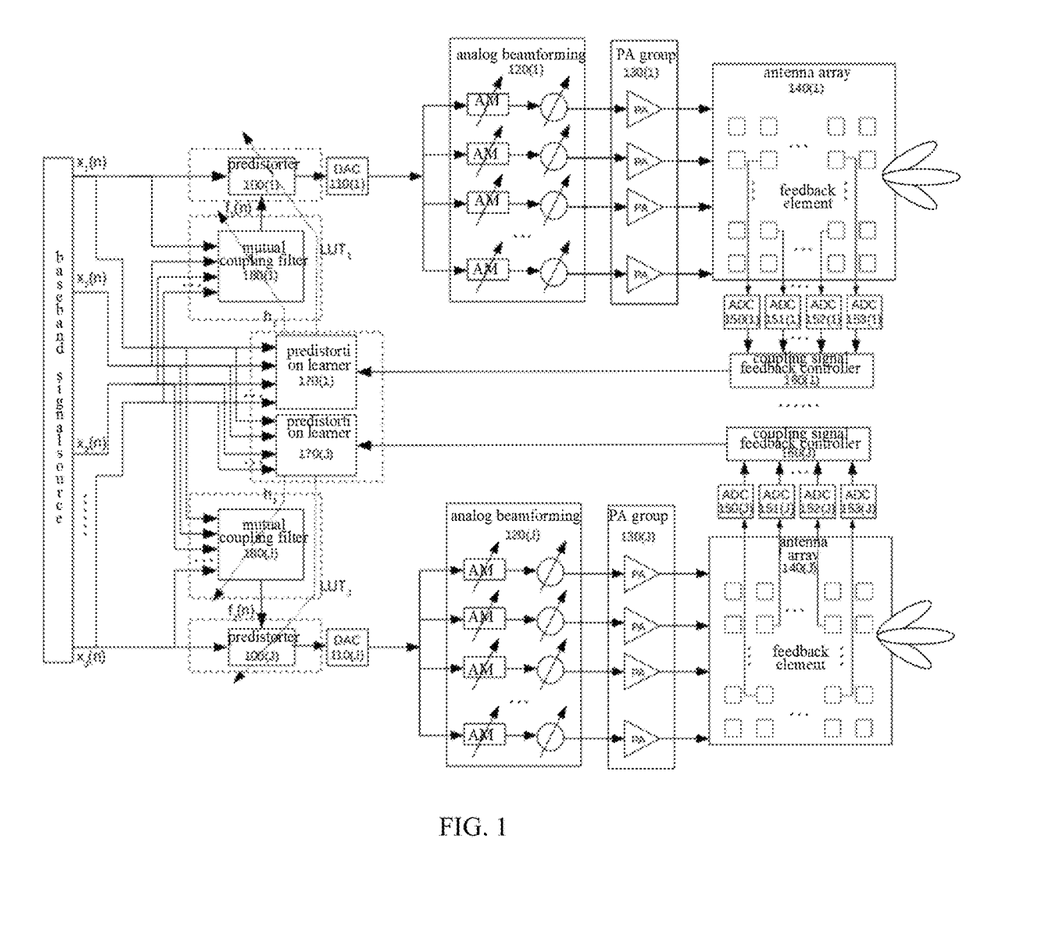
FIG. 1 is a schematic diagram of a DPD architecture of a MIMO scenario to which the signal distortion pre-correction method is adapted according to a first embodiment of the present application.
Figure 2:
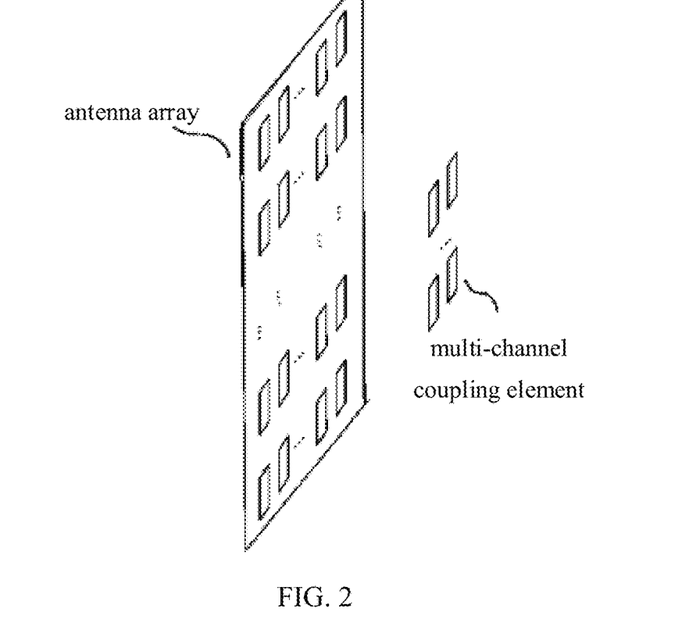
FIG. 2 is a schematic diagram of another DPD architecture of a MIMO scenario to which the signal distortion pre-correction method is adapted according to a first embodiment of the present application.

In order to facilitate the subsequent description of the signal distortion pre-correction method in this embodiment, a schematic structural diagram in which the DPD architecture suitable for the MIMO scenario shown in FIG. 1 is located in the array of the antenna array element is used as an example, that is, including a predistorter (the predistorter 100(1) to the predistorter 100(J) in FIG. 1 are hereinafter collectively referred to as the predistorter 100 for the convenience of description), a downlink digital-to-analog conversion (DAC) module (DAC110(1) to DAC110(J) in FIG. 1 are collectively referred to as the downlink DAC module 110 hereinafter for the convenience of description), an analog beamforming module (the analog beamforming 120(1) to the analog beamforming 120(J) in FIG. 1 are hereinafter collectively referred to as the analog beamforming module 120 for the convenience of description), a PA group (the PA group 130(1) to the PA group 130(J) in FIG. 1 are collectively referred to as the PA group 130 below for the convenience of description), an antenna array (the antenna array 140(1) to the antenna array 140(J) in FIG. 1 are hereinafter collectively referred to as the antenna array 140 for the convenience of description), a feedback link Analog-to-Digital Converter (ADC) module (ADC150(1) to ADC150(J), ADC151(1) to ADC151(J) . . . in FIG. 1 are collectively referred to as ADC150 hereinafter for the convenience of description), a coupling signal feedback controller (the coupling signal feedback controller 160(1) to the coupling signal feedback controller 160(J) in FIG. 1 are collectively referred to as the coupling signal feedback controller 160 below for the convenience of description), a predistortion learner (the predistortion learner 170(1) to the predistortion learner 170(J) in FIG. 1 are hereinafter collectively referred to as the predistortion learner 170 for the convenience of description), a mutual coupling filter (the mutual coupling filter 180(1) to the mutual coupling filter 180(J) in FIG. 1 are hereinafter collectively referred to as the mutual coupling filter 180 for the convenience of description), and a multi-channel coupling element (the feedback oscillator in FIG. 1 is also called a feedback element in practical applications, which will be hereinafter collectively referred to as a multi-channel coupling element for the convenience of description).

In addition, it should be noted that in practical applications, each digital channel sent by the baseband signal source will be assigned a set of components or functional modules from 100 to 180 listed above, and the predistortion learner 170 and the mutual coupling filter 180 corresponding to each digital channel will not only communicate with the paired digital channel, but also communicate with other digital channels.

It should be understood that the above given is only a schematic structural diagram of a DPD architecture that is adapted to a MIMO scenario, and does not constitute any limitations to the technical solutions of the present application. In specific implementation, those skilled in the art may make adaptive modifications as required, which is not limited in this embodiment.

Besides, in practical applications, in the DPD architecture suitable for MIMO scenarios, the multi-channel coupling element is arranged on the antenna substrate at the near-field position outside the antenna (as shown in FIG. 2). The digital channel also needs to include various components and functional modules shown in FIG. 1, that is, the two are only different in the layout of the multi-channel coupling element, and the others are roughly the same. In specific implementation, those skilled in the art can build a mechanism in which the multi-channel coupling element is arranged on the antenna substrate at the near-field position outside the antenna according to the structure shown in FIG. 1, which will not be repeated herein.

Figure 3:
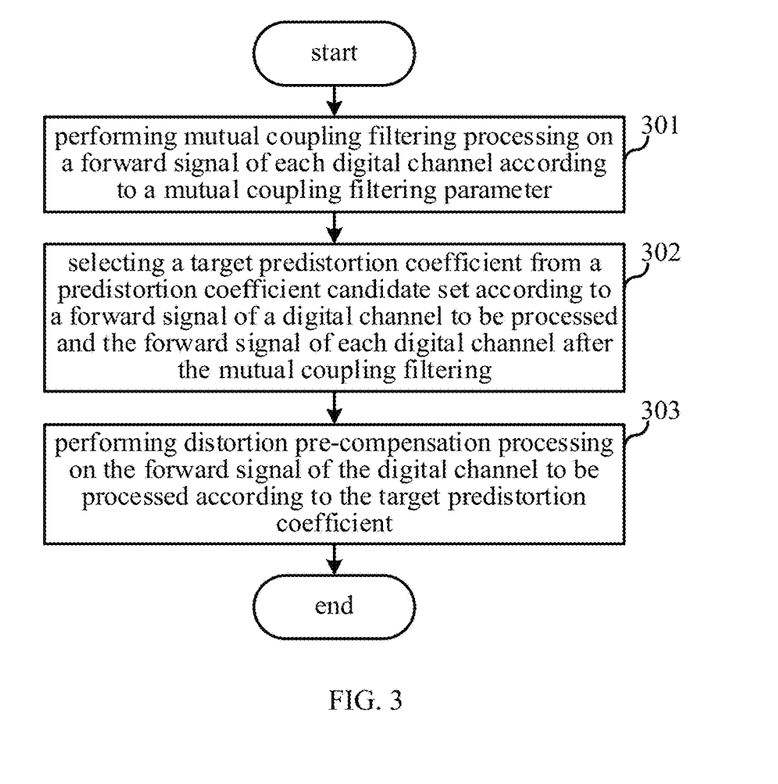
FIG. 3 is a flowchart of the signal distortion pre-correction method according to a first embodiment of the present application.

The process of this embodiment is shown in FIG. 3, including the following operations.

Operation 301, performing mutual coupling filtering processing on a forward signal of each digital channel according to a mutual coupling filter parameter.

In an embodiment, regarding the mutual coupling filtering processing in operation 301, it can be implemented by the mutual coupling filter 180 in FIG. 1 in practical applications. For ease of understanding, a detailed description is given below with reference to the basic structural diagram of the mutual coupling filter shown in FIG. 4.

Figure 4:
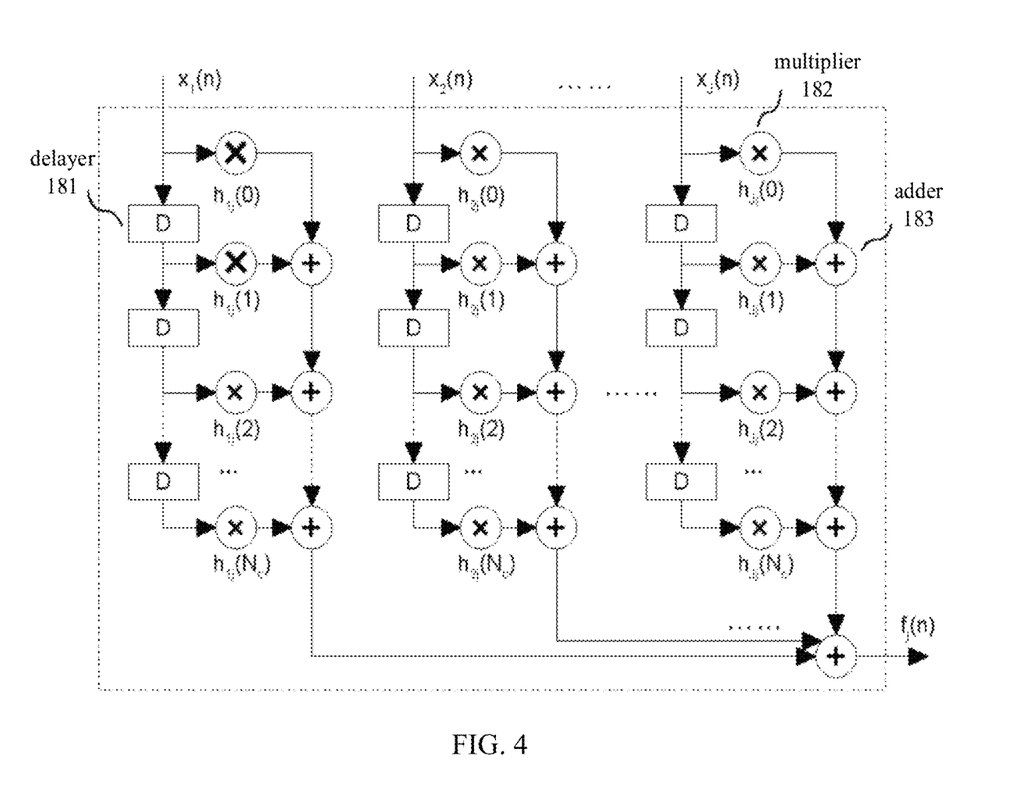
FIG. 4 is a basic structural diagram of a mutual coupling filter in a DPD architecture of a MIMO scenario to which the signal distortion pre-correction method is adapted according to a first embodiment of the present application.

First, a delayer 181 (D in FIG. 4) in the mutual coupling filter 180 performs delay processing on the forward signals ($X_1(n)$ to $X_J(n)$ in FIG. 4) of each digital channel. Then, a multiplier 182 in the mutual coupling filter 180 performs vector multiplication of the forward signal after the delay processing of each digital channel and the mutual coupling filter parameter corresponding to the digital channel in turn (operation of $h_{1,J}(0)$ to $h_{J,J}(N_C)$ in FIG. 4). Finally, an adder 183 in the mutual coupling filter 180 performs vector addition on the forward signal processed by the vector multiplication of the digital channels, so as to obtain the forward signals after mutual coupling filtering of each digital channel ($f_J(n)$ in FIG. 4).

By performing mutual coupling filtering processing on the forward signal of each digital channel according to the mutual coupling filter parameter, the mutual coupling interference between the antenna elements in the antenna array 140 can be approximately fitted. Further, when the forward signals of the digital channels after the mutual coupling filtering process participate in the subsequent signal distortion pre-correction processing, the final pre-distortion result can be more accurate.

In addition, the above-mentioned mutual coupling filter parameter is obtained by training according to the feedback signal collected by the multi-channel coupling element in this embodiment.

Furthermore, in a specific application, each digital channel corresponds to multiple channel beam angles, and different channel beam angles cause the digital channels to correspond to different mutual coupling filter parameters. Therefore, in order to take into account the differences in the mutual coupling filter parameters corresponding to each digital channel in the case of different channel beam angles, a mutual coupling filter parameter set can be constructed. That is, the mutual coupling filter parameters corresponding to the combination of each digital channel number and each channel beam angle are stored in the mutual coupling filter parameter set. Thus, when obtaining the mutual coupling filter parameters of each digital channel, it is only necessary to select from the mutual coupling filter parameter set obtained by training based on the feedback signal collected by the multi-channel coupling element according to the digital channel numbers of the digital channel and the channel beam angle.

Correspondingly, the operation performed in the above operation 301 is to perform mutual coupling filtering processing on the forward signal of each digital channel according to the selected mutual coupling filter parameters of the digital channel.

In this embodiment, in order to conveniently obtain the mutual coupling filter parameters corresponding to each digital channel under different channel beam angles, the function of the above-mentioned mutual coupling filter parameter set is realized by constructing a mutual coupling filter parameter table with the digital channel number and the channel beam angle as index parameters respectively.

Figure 5:
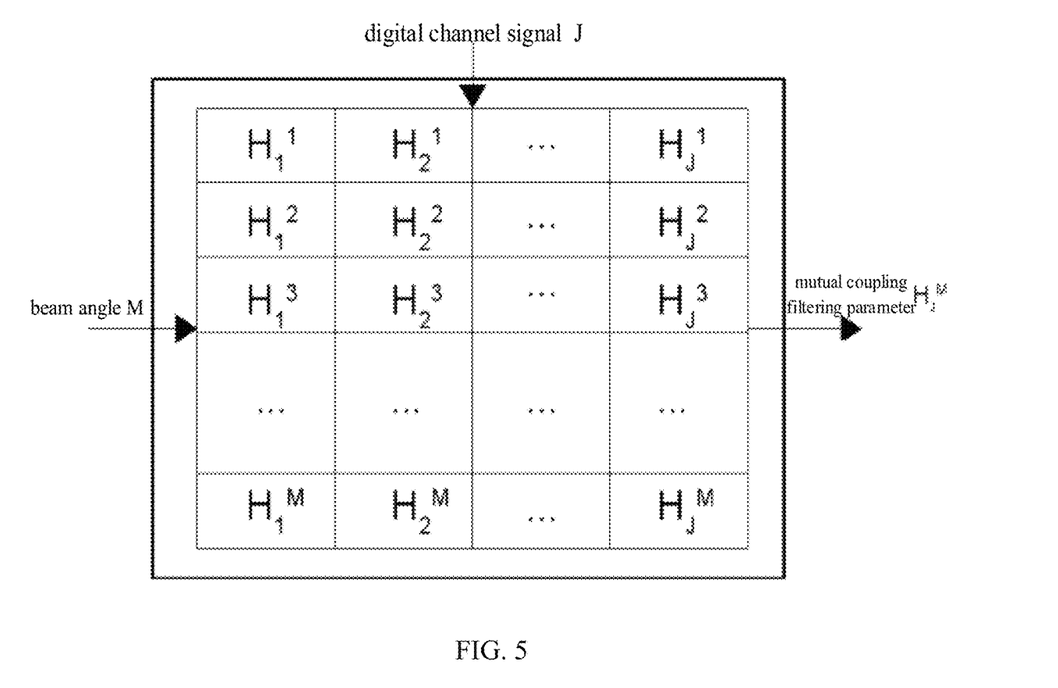
FIG. 5 is a schematic diagram of selecting mutual coupling filter parameters of each digital channel in the signal distortion pre-correction method according to a first embodiment of the present application.

For ease of understanding, the following description is given in conjunction with FIG. 5.

Specifically, it is assumed that there are M channel beam angles corresponding to each digital channel, and there are J digital channels corresponding to the baseband signal source. First, by numbering the beam angle of each channel, the channel beam angle number corresponding to the beam angle of each channel is obtained, specifically from 1 to M. By numbering each digital channel, the corresponding digital channel number of each digital channel is obtained, specifically from 1 to J. The row of the mutual coupling filter parameter table is constructed according to the number of the above-mentioned channel beam angles, and the column of the mutual coupling filter parameter table is constructed according to the number of the above-mentioned digital channels, and a mutual coupling filter parameter table as shown in FIG. 5 can be obtained. $H_J^M$ is the mutual coupling filter coefficient vector obtained by the digital channel J when the channel beam angle is M, that is, the mutual coupling filter parameters. The specific mutual coupling filter coefficient can be indexed through the digital channel number and the channel beam angle. That is to say, when selecting the mutual coupling filter parameters of each digital channel in the mutual coupling filter parameter table constructed above according to the digital channel number and channel beam angle of each digital channel, it is possible to locate the column where the mutual coupling filter parameter is located according to the digital channel number, locate the row where the mutual coupling filter parameter is located according to the channel angle number, and then determine the mutual coupling filter parameters of the digital channel corresponding to the digital channel number under the channel beam angle (the corresponding one of $H_1^1$ to $H_J^M$ in FIG. 5).

It should be understood that the above is only a way to find the mutual coupling filter parameters of each digital channel pair according to the digital channel number and the channel beam angle of the digital channels, and does not constitute any limitation to the technical solution of the present application. Those skilled in the art can set as required in practical applications, which is not limited herein.

In addition, regarding the feedback signal collected by the above-mentioned multi-channel coupling element, for ease of understanding, the following description is still made with reference to the structure shown in FIG. 1.

Take the processing of one digital channel as an example, as shown in FIG. 1, each coupling element set in the antenna array 140(1) transmits the feedback RF signal to the corresponding analog-to-digital conversion module ADC, ADC150 (1), ADC151 (1), ADC152 (1), ADC153 (1) in FIG. 1, the analog-to-digital conversion of the RF signal fed back by the corresponding coupling element is performed by the ADC to obtain the equivalent baseband feedback signal of the digital segment. The obtained equivalent baseband feedback signal is transmitted to the coupling signal feedback controller 160(1), and the above-mentioned equivalent baseband feedback signal is processed by the coupling signal feedback controller 160(1). Then, the feedback signal collected by the multi-channel coupling element in this embodiment is obtained.

The processing of the above-mentioned equivalent baseband feedback signal by the coupling signal feedback controller 160(1) will be described below with reference to FIG. 6.

For ease of understanding, the following briefly describes the internal structure of the coupling signal feedback controller 160(1).

Figure 6:
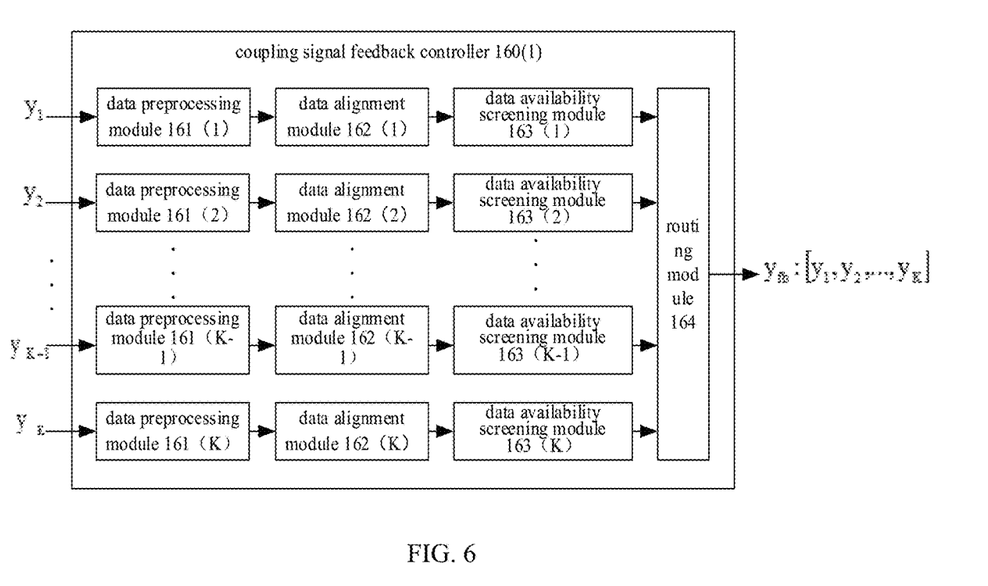
FIG. 6 is a basic structural diagram of a coupling signal feedback controller in a DPD architecture of a MIMO scenario to which the signal distortion pre-correction method is adapted according to a first embodiment of the present application.

The coupling signal feedback controller 160(1) mainly includes a plurality of data preprocessing modules 161 (data preprocessing module 161(1) to data preprocessing module 161(K) in FIG. 6), a plurality of data alignment modules 162 (data alignment modules 162(1) to data alignment modules 162(K) in FIG. 6), a plurality of data availability screening modules 163 (data availability screening module 163(1) to data availability screening module 163(K) in FIG. 6), and a routing module 164.

The data preprocessing module 161, the data alignment module 162, and the data availability screening module 163 are in one-to-one correspondence. Each group of data preprocessing module 161, data alignment module 162, and data availability screening module 163 corresponds to an equivalent baseband feedback signal fed back by an ADC. That is, the value of K in FIG. 6 is determined by the number of channels of the above-mentioned equivalent baseband feedback signal.

Based on the above structure, the processing performed by the coupling signal feedback controller 160(1) on the above-mentioned equivalent baseband feedback signal is as follows:

First, the data preprocessing module 161 corresponding to each equivalent baseband feedback signal performs processing operations such as image calibration, frequency point switching, feedback equalization, or the like, on the input equivalent baseband feedback signal, transmits the processed equivalent baseband feedback signal to the corresponding data alignment module 162. Then, each data alignment module 162 performs alignment processing on the corresponding equivalent baseband feedback signal and forward signal, mainly including processing operations such as time delay alignment and amplitude phase alignment, and transmits the processed equivalent baseband feedback signal to the corresponding data availability screening module 163. Next, each data availability screening module 163 checks the corresponding equivalent baseband feedback signal to exclude abnormal data, and transmits the processed equivalent baseband feedback signal to the routing module 164. Finally, the routing module 164 performs data splicing on the processed equivalent baseband feedback signal, specifically, performs final splicing in the time domain, so as to obtain the feedback signal collected by the multi-channel coupling element in this embodiment, that is, $y_{fb}$:[$y_1$, $y_2$, ..., $y_k$] in FIG. 6.

Besides, regarding the above checks performed in each data availability screening module 163, the operation performed when abnormal data is detected is that the corresponding data availability screening module 163 sets the signals of all links of the corresponding path to 0.

It should be understood that the above given is only a specific way to obtain the feedback signal collected by the multi-channel coupling element, and does not constitute any limitation to the technical solution of the present application. Those skilled in the art can set as required in practical applications, which is not limited herein.

Operation 302, selecting a target predistortion coefficient from a predistortion coefficient candidate set according to a forward signal of a digital channel to be processed, and the forward signal of each digital channel after the mutual coupling filtering.

In order to facilitate the acquisition of target predistortion coefficient, the above-mentioned predistortion coefficient candidate set includes a two-dimensional look-up table (2D-LUT). The two-dimensional look-up table is configured to store a relationship between a combination of a modulus value of the forward signal and a modulus value of the forward signal of each digital channel after mutual coupling filtering and a predistortion coefficient.

The operation S302 of selecting the target predistortion coefficient from the predistortion coefficient candidate set includes:

searching for the 2D-LUT according to the modulus value of the forward signal of the digital channel to be processed, and the modulus value of the forward signal of each digital channel after the mutual coupling filtering to obtain a corresponding predistortion coefficient. Finally, the found predistortion coefficient is used as the target predistortion coefficient.

In this embodiment, due to practical applications, different predistortion systems exist under different signal delay conditions. Therefore, in order to make the final distortion pre-compensation process as accurate as possible, the predistortion coefficient candidate set includes a plurality of 2D-LUTs corresponding to different signal delays.

The operation of searching for the 2D-LUT includes: searching for each of the 2D-LUTs, respectively, according to the modulus value of the forward signal of the digital channel to be processed, and the modulus value of the forward signal of each digital channel after the mutual coupling filtering to obtain predistortion coefficients corresponding to each of the 2D-LUTs. Finally, the predistortion coefficients corresponding to the found 2D-LUTs are respectively used as the target predistortion coefficients, that is, there are a plurality of finalized target predistortion coefficients.

Operation 303, performing distortion pre-compensation processing on the forward signal of the digital channel to be processed according to the target predistortion coefficient.

It can be known from the description in operation 302 that there are the plurality of target predistortion coefficients found, that is, the corresponding predistortion coefficients in each 2D-LUT found according to the above search method are all target predistortion coefficients. Therefore, the distortion pre-compensation processing performed in operation 303 is essentially to perform distortion pre-compensation processing on the forward signal of the digital channel to be processed according to the plurality of pre-distortion coefficients found.

In order to facilitate the understanding of the above operation 302 and operation 303, a specific description is given below with reference to FIG. 7.

Figure 7:
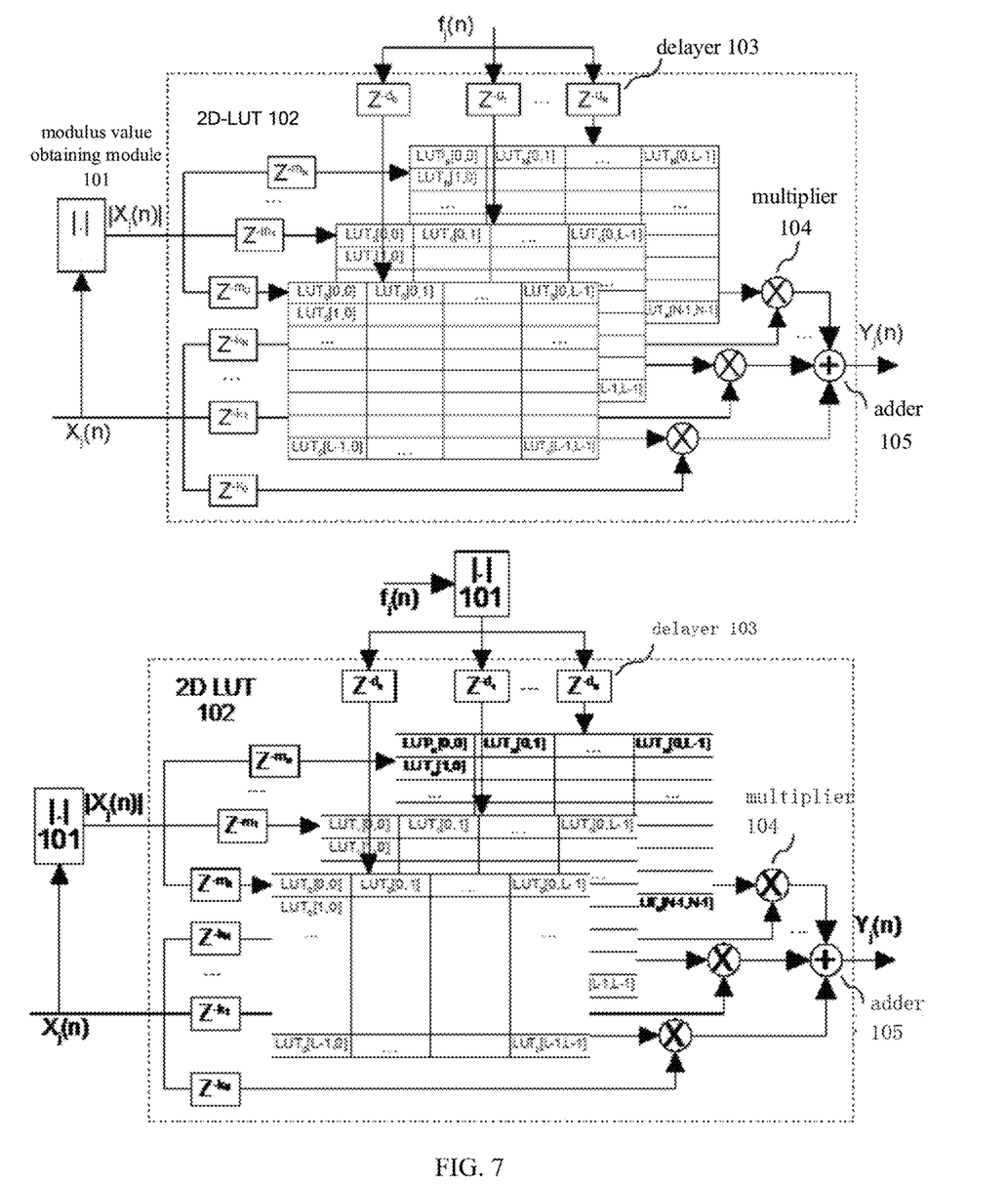
FIG. 7 is a basic structural diagram of a predistorter in a DPD architecture of a MIMO scenario to which the signal distortion precorrection method is adapted according to a first embodiment of the present application.

FIG. 7 is a basic structural diagram of the predistorter 100 in the structure shown in FIG. 1.

As shown in FIG. 7, the predistorter 100 mainly includes a modulus value obtaining module 101, a 2D-LUT module 102 (for storing multiple 2D-LUTs corresponding to different signal delays), a delayer 103, a multiplier 104 and an adder 105.

The number of delayers 103 and multipliers 104 is determined according to the number of two-dimensional look-up tables stored in the 2D-LUT module 102, that is, each two-dimensional look-up table needs to correspond to one delayer 103 and one multiplier 104.

For the convenience of description, in FIG. 7, N 2D-LUTs are stored in the 2D-LUT module 102.

When the target predistortion coefficient is selected based on the predistorter 100 with the structure shown in FIG. 7, the forward signal $X_j(n)$ of the digital channel to be processed is input into the modulus value obtaining module 101 (the modulus value obtaining module corresponding to $X_j(n)$ in FIG. 7). Then, the modulus value $|X_j(n)|$ of the forward signal of the digital channel to be processed is obtained. Next, the obtained $|X_j(n)|$ are respectively signal-delayed by N delayers ($Z^{-m0}$ to $Z^{-mN}$ in FIG. 7) to obtain the $|X_j(n)|$ after N signal delays. The forward signals $f_j(n)$ of each digital channel after the mutual coupling filtering are input to the modulus value obtaining module 101. Then, the modulus values $|f_j(n)|$ of the forward signals of the digital channels after the mutual coupling filtering are obtained. Then, the obtained $|f_j(n)|$ are respectively signal-delayed through N delayers ($Z^{-d0}$ to $Z^{-dN}$ in FIG. 7), to obtain the modulus value of the forward signal after the N signal delays. Each modulus value is corresponding to a two-dimensional look-up table, and then the corresponding pre-distortion coefficient is found from each two-dimensional look-up table.

It should be noted that the above Z is a delayer. Since the forward signal is multiplied by the pre-distortion coefficients found by each 2D-LUT, and each multiplication result is added to obtain the pre-corrected forward signal, there will be N forward signals delayed by the signal, which are respectively multiplied by the N predistortion coefficients found; m represents a delayer for delaying the modulus value of the forward signal, d represents the delayer that delays the forward signals $f_j(n)$ of the digital channels after mutual coupling filtering, k represents a delayer that delays the forward signal.

Correspondingly, when performing distortion pre-compensation processing based on the predistorter 100 with the structure shown in FIG. 7, the predistortion coefficients corresponding to the found 2D-LUTs are vector-multiplied by the corresponding multipliers 104 with $Z^{-k_N}$ corresponding to the forward signal $X_j(n)$ of the digital channel to be processed, respectively. The multiplication results are added by the adder 105 to obtain the pre-corrected forward signal, i.e., $Y_j(n)$ in FIG. 7.

In addition, in order to facilitate the understanding of the above-mentioned two-dimensional look-up table, this embodiment will be described with the two-dimensional look-up table shown in FIG. 7. In any two-dimensional lookup table $LUT_j[m,n]$, j represents the digital channel number, and the values of m and n are [0, 1, ... L−1]. L is the length of the two-dimensional look-up table, or the length of the matrix of the two-dimensional look-up table.

In addition, with reference to the schematic structural diagram of the DPD architecture adapted to the MIMO scenario shown in FIG. 1, it can be seen that, in practical applications, the architecture further includes a downlink DAC module 110, an analog beamforming module 120, a PA group 130, and an antenna array 140. Therefore, after performing the above operation 303, the method may further include the following processing:

First, digital-to-analog conversion is performed on the forward signal processed by the distortion pre-compensation to obtain an analog signal.

Then, analog beamforming processing is performed on the analog signal.

Next, power amplification processing is performed on the output signal processed by the analog beamforming to generate a radio frequency signal that meets the power requirements.

Finally, the radio frequency signal is sent through the array of antenna elements.

As shown in FIG. 1, the essence is that the downlink DAC module performs digital-to-analog conversion on the forward signal processed by the predistorter 100 for distortion pre-compensation, and then transmits the obtained analog signal to the analog beamforming module 120. Next, the analog beamforming module 120 performs analog beamforming processing on the analog signal, and transmits the processed output signal to the PA group 130. Next, the PA group 130 performs power amplification processing on the output signal processed by the analog beamforming to generate a radio frequency signal that meets the power requirements. Finally, the obtained radio frequency signal is sent out through the antenna array 140.

This embodiment provides a signal distortion pre-correction method. The mutual coupling filter parameters and the predistortion coefficient candidate set are obtained by training the feedback signal collected by the multi-channel coupling element, so that the mutual coupling filtering processing can be performed on the forward signal of the digital channel according to the obtained mutual coupling filter parameter, to make the target predistortion coefficient selected in the predistortion coefficient candidate set according to the forward signal after mutual coupling filtering and the forward signal of the digital channel to be processed to be the predistortion coefficient considering the mutual coupling factor of the digital channel. Further, the distortion pre-compensation processing performed on the forward signal of the digital channel to be processed according to the target pre-distortion coefficient can reduce the influence on the characteristics of the power amplifier as much as possible, and greatly improve the accuracy of signal distortion pre-correction, so that the performance advantages of the MIMO beamforming system can be better exerted.

In addition, it is not difficult to find from the above description that the signal distortion pre-correction method provided by this embodiment can effectively solve the problem of accuracy of signal distortion pre-compensation processing in an application scenario where one predistorter corresponds to multiple PAs in a DPD architecture adapted to a MIMO scenario. Since the multi-channel coupling element that provides the feedback signal in this embodiment does not need to be arranged remotely, the complexity of the architecture is greatly reduced, while the implementation cost is reduced, the later installation and maintenance are also greatly facilitated, thereby effectively improving the product competitiveness.

Figure 8:
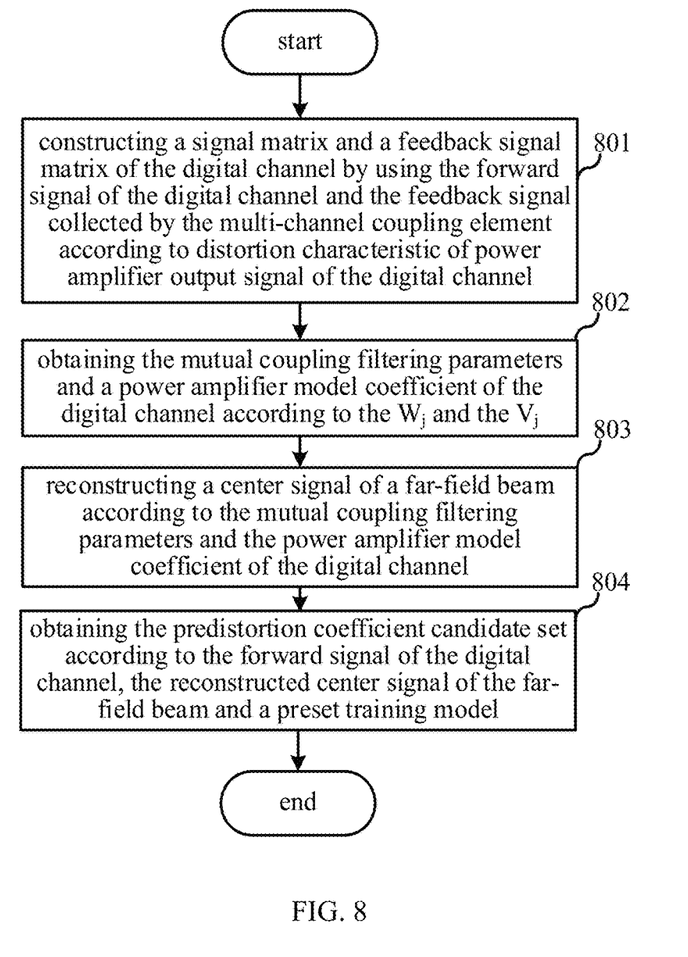
FIG. 8 is a flowchart of training a predistortion candidate set in the signal distortion precorrection method according to a second embodiment of the present application.

As shown in FIG. 8, FIG. 8 is a flowchart of training a predistortion coefficient candidate set in a signal distortion pre-correction method according to a second embodiment of the present application.

Based on the above-mentioned first embodiment, in this embodiment, the operation of obtaining the predistortion coefficient candidate set by training the feedback signal collected by the multi-channel coupling element will be described in detail. For ease of understanding, a detailed description is given below with reference to FIG. 8.

Operation 801, constructing a signal matrix $W_j$ and a feedback signal matrix $V_j$ of the digital channel by using the forward signal of the digital channel and the feedback signal collected by the multi-channel coupling element according to distortion characteristic of power amplifier output signal of the digital channel.

In this embodiment, the j in the signal matrix $W_j$ and the feedback signal matrix $V_j$ represents a channel number of the digital channel.

Besides, it should be noted that, when considering the distortion characteristics of the power amplifier output signal corresponding to each digital channel and the influence of mutual coupling interference between the antenna arrays, the relational expression between the forward signal $x_j$ of the jth digital channel and the feedback signal $y'_j$ (collected by the multi-channel coupling element) can be approximately expressed as formula (1):

$$y'_j = f(x_j, h_{1j}*x_1, h_{2j}*x_2, \ldots, h_{ij}*x_i, \ldots, h_{Jj}*x_J), j=1, 2, \ldots J \quad (1)$$

In the formula (1), f(•) is a nonlinear function describing the distortion characteristics of the power amplifier output signal; * is a linear convolution operator; $h_{ij}$ is the mutual coupling filter parameter vector of the i-th digital channel to the j-th digital channel; $x_i$ is the forward signal of the i-th digital channel; $h_{ij}*x_i$ represents the crosstalk influence component of the i-th digital channel to the j-th digital channel.

Therefore, when constructing the above-mentioned two matrices, it is necessary to first obtain the power amplifier model coefficient of the analog channel corresponding to the digital channel by modeling, so as to reflect the distortion characteristics of the power amplifier output signal of the digital channel. The specific operations are as follows:

First, according to the specific power amplifier model (for example, the memory cross-polynomial model), the forward signal $x_j$ and the feedback signal $y'_j$ after linear processing are selected. The Least Square (LS) algorithm can be used to cross-estimate the power amplifier model coefficient and the mutual coupling filter parameter until the mutual coupling filter parameter $h_j$ and the power amplifier model coefficient $c_{PA}$ that meet the accuracy requirements are obtained.

Then, the linearly processed forward signal and feedback signal of other digital channels are selected to perform the same operation as above to obtain the mutual coupling filter parameters of each digital channel as the final estimated value of the mutual coupling filter parameters, and the final estimated value is uploaded to the mutual coupling filter 180 of each digital channel.

In addition, in this embodiment, in order to eliminate the nonlinear distortion of the center signal of the far-field beam, a measure taken in this embodiment is to introduce a general predistorter 100 into each digital channel. Therefore, in order to obtain the mutual coupling filter parameters and the forward signals of each digital channel after mutual coupling filtering, it is necessary to model in the predistortion learner 170 first to obtain the power amplifier model coefficients corresponding to the power amplifier output signals of each digital channel.

In order to facilitate the understanding of the operation 801, in this embodiment, the above-mentioned signal matrix $W_j$ and feedback signal matrix $V_j$ are constructed by taking the power amplifier model as a memory cross-polynomial model as an example.

When the power amplifier model is a memory cross-polynomial model, the signal matrix $W_j$ and the feedback signal matrix $V_j$ can be constructed based on formulas (2) to (5), which are as follows:

$$W_j^{lk} = \begin{bmatrix} x_j(n-l) \cdot |x_j(n-l)|^0 \cdot f_j^k(n-l) & x_j(n-l) \cdot |x_j(n-l)|^1 \cdot f_j^k(n-l) & \cdots & x_j(n-l) \cdot |x_j(n-l)|^M \cdot f_j^k(n-l) \\ x_j(n-l+1) \cdot |x_j(n-l+1)|^0 \cdot f_j^k(n-l+1) & x_j(n-l+1) \cdot |x_j(n-l+1)|^1 \cdot f_j^k(n-l+1) & \cdots & x_j(n-l+1) \cdot |x_j(n-l+1)|^M \cdot f_j^k(n-l+1) \\ \vdots & \vdots & \ddots & \vdots \\ x_j(n-l+N) \cdot |x_j(n-l+N)|^0 \cdot f_j^k(n-l+N) & x_j(n-l+N) \cdot |x_j(n-l+N)|^1 \cdot f_j^k(n-l+N) & \cdots & x_j(n-l+N) \cdot |x_j(n-l+N)|^M \cdot f_j^k(n-l+N) \end{bmatrix} \quad (2)$$

$$W_j^b = [W_j^{00}, W_j^{01}, \ldots W_j^{0K}, W_j^{10}, \ldots, W_j^{lk}, \ldots, W_j^{LK}]; l=0,1,\ldots,L; k=0,1,\ldots,K \quad (3)$$

$$W_j = \left[ W_j^b, W_j^b \cdot e^{j(\beta+\theta)}, W_j^b \cdot e^{j2(\beta+\theta)}, \ldots, W_j^b \cdot e^{j(Z-1)(\beta+\theta)} \right] \quad (4)$$

$$V_j = \begin{bmatrix} y'_j(n) \\ y'_j(n+1) \\ \vdots \\ y'_j(n+N) \end{bmatrix} \quad (5)$$

In the above formula (2) to formula (5), l(l=0, ..., L), m(m=0, ..., M), k(k=0, ..., K) are the memory depth of the polynomial model, the nonlinear order of the signal modulus value, and the nonlinear order of the signal after mutual coupling filtering. $W_j^{lk}$ is the intermediate quantity constructed by the matrix; n is the current moment; N is the number of sampling points involved in the operation; $x_j(n-1)$ is the forward signal at time n−1 of the jth channel; $x_j(n-l+1)$ is the forward signal at time n−l+1 of the jth channel; $x_j(n-l+N)$ is the forward signal at time n−l+N of the jth channel; $|x_j(n-1)|^o$ is the modulus value of the forward signal at time n−1 of the jth channel; $|x_j(n-l+1)|^o$ is the modulus value of the forward signal at time n−l+1 of the jth channel; $|x_j(n-l+N)|^o$ is the modulus value of the forward signal at time n−l+N of the jth channel.

Correspondingly, $f_j^k(n-1)$ is the forward signal at time n−1 of the jth channel after mutual coupling filtering; $f_j^k(n-l+1)$ is the forward signal at time n−l+1 of the jth channel after mutual coupling filtering; $f_j^k(n-l+N)$ is the forward signal at time n−l+N of the jth channel after mutual coupling filtering; N+1 is the data length for constructing the matrix, which is formed by splicing the feedback signals of the multi-channel coupling element; Z is the number of analog channels corresponding to each digital channel, that is, the number of output signals of the power amplifier, β is the phase modulation amount of the analog beamforming, and θ is the phase difference between each transmitting element and the coupling element; $f_j^k(n-1)=h_{1j}*x_1(n-1)+h_{2j}*x_2(n-1)+ \ldots +h_{Jj}*x_J(n-1)$ is the forward signal corresponding to each digital channel after mutual coupling filtering.

Therefore, the feedback signal collected by the multi-channel coupling element corresponding to the digital channel j can be expressed as the following formula:

$$V_j = W_j \cdot c_{PA} \quad (6)$$

In the formula, $c_{PA}$ represents the power amplifier model coefficient. It should be noted here that the information contained in the $c_{PA}$ not only includes the PA characteristics of each analog channel, but also includes the influence information of the coupling characteristics between the various analog channels.

In this embodiment, the above-mentioned power amplifier model coefficient $c_{PA}$ can be obtained by fitting with the help of the LS algorithm, and the specific formula used is as follows:

$$c_{PA} = (W_j^H W_j)^{-1} W_j^H W_j \quad (7)$$

In the formula, the superscript H represents the conjugate transpose of the matrix.

Operation 802, obtaining the mutual coupling filter parameters and a power amplifier model coefficient $c_{PA}$ of the digital channel according to the $W_j$ and the $V_j$.

Specifically, the power amplifier model coefficient $c_{PA}$ can be obtained based on the above formula (7). However, since the $h_{ij}(i=0, 1, \ldots, J)$ parameters are unknown, the mutual coupling filter parameters of the digital channel need to establish the error objective function with the help of the nonlinear distortion expression of the feedback signal (formula (6)) $V_j = W_j \cdot c_{PA}$. Then, the parameter solving method is used to extract the mutual coupling parameters, and after multiple iterations, the mutual coupling filter parameters $h_{ij}$ are obtained.

In this embodiment, the above-mentioned iterative algorithm for solving parameters includes but is not limited to the following formulas:

$$\begin{cases} c(n) = \mu(n) \cdot K(n) \cdot e^H(n) \\ K(n) = \dfrac{\lambda^{-1} P(n-1) \cdot x(n)}{1 + \lambda^{-1} x^H(n) \cdot P(n-1) \cdot x(n)} \\ P(n) = \lambda^{-1} P(n-1) - \lambda^{-1} K(n) \cdot x^H(n) \cdot P(n-1) \end{cases} \quad (8)$$

$$c(n) = \mu(n) \cdot x(n) \cdot e^H(n) \quad (9)$$

$$\begin{cases} c(n) = \mu(n) \cdot x(n) \cdot e_h(n) \\ e_h(n) = \sum_{l=0}^{N} h(N-l) \cdot e^H(n-l) \end{cases} \quad (10)$$

In the formula, μ and λ are the adjustment factors of the iterative algorithm; c(n) is the power amplifier model coefficient $c_{PA}$ of the nth iteration; x(n) is the input signal of the distortion pre-correction model; $e^H$ is the conjugate transpose operation of the complex vector; e(n) is the fitting error value at the current moment obtained by the pre-correction model; h(n) is the weighting coefficient of the error signal e(n).

Operation 803, reconstructing a center signal of a far-field beam according to the mutual coupling filter parameters and the power amplifier model coefficient $c_{PA}$ of the digital channel.

Regarding the operation of reconstructing the center signal of the far-field beam, please refer to formula (11) for details:

$$V_c = W_c \cdot c_{PA} \quad (11)$$

$V_c$ represents the center signal of the far-field beam, and $W_c$ represents the signal matrix related to the center angle of the beam, which may be a de-beamforming matrix in practical applications.

Regarding the construction of the de-beamforming matrix $W_c$, please refer to formula (12) for details.

$$W_c = [W_j^b, W_j^b \cdot e^{j(\beta+\theta_d)}, W_j^b \cdot e^{j2(\beta+\theta_d)}, \ldots, W_j^b \cdot e^{j(Z-1)(\beta+\theta_d)}] \quad (12)$$

$\theta_d$ is the beam center pointing angle, which can be considered as $\theta_d + \beta = 0$ in practical applications.

The parameters required to construct the de-beamforming matrix $W_c$ based on formula (12) are similar to those required to construct the signal matrix $W_j$ of the digital channel based on formula (4) above. The main difference is that in formula (4), θ is the phase difference from each transmitting element to the coupling element, and in formula (12), θ is the beam center pointing angle. For the description of other parameters, please refer to the above description, which will not be repeated herein.

Operation 804, obtaining the predistortion coefficient candidate set according to the forward signal of the digital channel, the reconstructed center signal of the far-field beam and a preset training model.

It should be understood that the above-mentioned training model is the predistortion model. It can be seen from the above description that based on the model coefficients $c_{PA}$ of each power amplifier obtained by the above method and the mutual coupling filter parameters of the digital channel, the far-field signal $y_j^{center}(n)$ in the direction of the beam center at the current moment of the configuration of the digital channel can be reconstructed. Therefore, with the help of the forward signal $x_j(n)$ and the reconstructed far-field signal $y_j^{center}(n)$, and the memory polynomial model, the predistortion model expression (i.e., the above-mentioned training model) can be constructed according to formula (13):

$$x_j(n) = \sum \ldots \sum c_{km}|x_j(n-m_1)|^l y_j^{center}(n-m_2) f_j(n-m_3)^k \quad (13)$$
$$= \sum LUT_j(x_j(n-m_1), f_j(n-m_3)) \cdot y_j^{center}(n-m_2)$$

In the formula, the coefficient $c_{km}$ is the DPD parameter to be determined, which can be calculated by the LS algorithm or the LMS algorithm. Since the modulus value of the forward signal $|x_j(n)|$ and the order of the signal $f_j(n)$ after mutual coupling filtering can be matched, in this embodiment, a 2D-LUT (that is, a two-dimensional look-up table) with $|x_j(n)|$ and $f_j(n)$ as index quantities is used to perform predistortion processing. The predistortion coefficients to be recorded in each 2D-LUT table can be obtained according to the above manner.

This embodiment provides a signal distortion pre-correction method. During the process of training the predistortion coefficient candidate set, the center signal of the far-field beam is reconstructed through the mutual coupling filter parameters and power amplifier model coefficients based on the digital channel. The forward signal of the digital channel and the reconstructed far-field beam center information are extracted as needed as the parameters of the input predistortion model (training model). Therefore, it is not necessary to set a coupling loop for each coupling element, so that relatively perfect feedback information can be obtained. Thus, the pre-distortion correction of the signal is more accurate, which greatly reduces the difficulty of implementation, and reduces the implementation cost as much as possible while reducing the difficulty of maintenance.

In addition, those skilled in the art can understand that, the operations of the above various methods are divided only for the purpose of describing clearly, and can be combined into one operation or split into some operations during implementation, and decomposed into multiple operations, as long as the same logical relationship is included, which are all within the protection scope of the present application. Adding insignificant modifications to the algorithm or process or introducing insignificant designs without changing the core design of the algorithm and process is within the protection scope of the present application.

Figure 9:
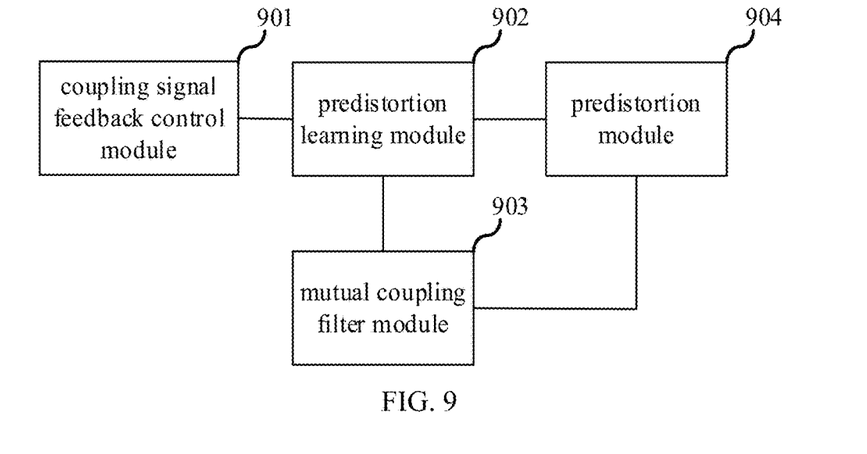
FIG. 9 is a schematic structural diagram of a signal distortion pre-correction device according to a third embodiment of the present application.

A third embodiment of the present application relates to a signal distortion pre-correction device, as shown in FIG. 9.

The signal distortion pre-correction device includes a coupling signal feedback control module 901, a predistortion learning module 902, a mutual coupling filter module 903 and a predistortion module 904.

The coupling signal feedback control module 901 is connected to the predistortion learning module 902, the predistortion learning module 902 is respectively connected to the mutual coupling filter module 903 and the predistortion module 904, and the mutual coupling filter module 903 is connected to the predistortion module 904.

The coupling signal feedback control module 901 is configured to obtain a feedback signal collected by a multi-channel coupling element, and transmit the feedback signal to the predistortion learning module 902. The multi-channel coupling element is provided in the radome of the whole machine, or is provided on the antenna substrate at the near-field position outside the antenna.

The predistortion learning module 902 is configured to obtain mutual coupling filter parameters and predistortion coefficient candidate set through training the feedback signal collected by the multi-channel coupling element, transmit the mutual coupling filter parameter to the mutual coupling filter module 903, and transmit the predistortion coefficient candidate set to the predistortion module 904.

The mutual coupling filter module 903 is configured to perform mutual coupling filtering processing on the forward signals of the digital channels according to the mutual coupling filter parameters, and transmit the forward signals of the digital channels after the mutual coupling filtering to the predistortion module 904.

The predistortion module 904 is configured to select a target predistortion coefficient from the predistortion coefficient candidate set according to the forward signal of the digital channel to be processed and the forward signals of the digital channels after the mutual coupling filtering, and perform distortion pre-compensation processing on the forward signal of the digital channel to be processed according to the target predistortion coefficient.

Based on the description of the above method embodiments and the schematic structural diagram of the DPD architecture adapted to the MIMO scenario shown in FIG. 1, it can be known that, in practical applications, the above-mentioned coupling signal feedback control module 901 may be the coupling signal feedback controller 160 shown in FIG. 1. The predistortion learning module 902 may be the predistortion learner 170 shown in FIG. 1. The mutual coupling filter module 903 may be the mutual coupling filter 180 shown in FIG. 1. The predistortion module 904 may be the predistorter 100 shown in FIG. 1.

In addition, it is worth mentioning that in practical applications, the above functional modules can be implemented by selecting specific components such as a coupling signal feedback controller, a predistortion learner, a mutual coupling filter, and a predistorter, or by compiling corresponding software programs based on the working principles of these components, which is not limited in this embodiment.

Besides, in another example, the predistortion coefficient candidate set includes a two-dimensional look-up table, the two-dimensional look-up table is configured to store a relationship between a combination of a modulus value of the forward signal and a modulus value of the forward signal of each digital channel after mutual coupling filtering and a predistortion coefficient.

Correspondingly, the predistortion module 904 is configured to search for the two-dimensional look-up table according to the modulus value of the forward signal of the digital channel to be processed, and the modulus value of the forward signal of each digital channel after the mutual coupling filtering to obtain a corresponding predistortion coefficient, which is used as the target predistortion coefficient.

Furthermore, in another example, the predistortion coefficient candidate set includes a plurality of the two-dimensional lookup tables corresponding to different signal delays.

Correspondingly, the predistortion module 904 is further configured to search for each of the two-dimensional look-up tables, respectively, according to the modulus value of the forward signal of the digital channel to be processed, and the modulus value of the forward signal of each digital channel after the mutual coupling filtering to obtain predistortion coefficients corresponding to each of the two-dimensional look-up tables, which are respectively used as the target predistortion coefficients, and vector-multiply the predistortion coefficients corresponding to each of the two-dimensional look-up tables with the forward signal of the digital channel to be processed, respectively, and add multiplication results to obtain a pre-corrected forward signal.

In another example, the mutual coupling filter module 903 is configured to select the mutual coupling filter parameter of each digital channel in the mutual coupling filter parameter set obtained by training the feedback signal collected by the multi-channel coupling element according to a digital channel number and channel beam angle of each digital channel, wherein the mutual coupling filter parameter set comprises mutual coupling filter parameters corresponding to a combination of each digital channel number and each channel beam angle; and perform the mutual coupling filtering process on the forward signal of each digital channel according to selected mutual coupling filter parameters of each digital channel.

Besides, the predistortion learning module 902 is configured to construct a signal matrix $W_j$ and a feedback signal matrix $V_j$ of the digital channel by using the forward signal of the digital channel and the feedback signal collected by the multi-channel coupling element according to distortion characteristic of power amplifier output signal of the digital channel, wherein the j represents a channel number of the digital channel; obtain the mutual coupling filter parameters and a power amplifier model coefficient $c_{PA}$ of the digital channel according to the $W_j$ and the $V_j$; reconstruct a center signal of a far-field beam according to the mutual coupling filter parameters and the power amplifier model coefficient $c_{PA}$ of the digital channel; and obtain the predistortion coefficient candidate set according to the forward signal of the digital channel, the reconstructed center signal of the far-field beam and a preset training model.

This embodiment is a device embodiment corresponding to the first or second embodiment, and this embodiment can be implemented in cooperation with the first or second embodiment. The related technical details mentioned in the first or second embodiment are still valid in this embodiment, and are not repeated here in order to reduce repetition. Correspondingly, the related technical details mentioned in this embodiment can also be applied in the first or second embodiment.

The modules involved in this embodiment are all logical modules. In practical applications, a logical unit may be a physical unit, a part of a physical unit, or a combination of multiple physical units. In addition, in order to highlight the innovative part of the present application, this embodiment does not introduce units that are not closely related to solving the technical problem raised by the present application, but this does not mean that there are no other units in this embodiment.

A fifth embodiment of the present application relates to a non-volatile storage medium for storing a computer-readable program. The computer-readable program is used for the computer to execute the signal distortion pre-correction method mentioned in the above method embodiments.

That is, those skilled in the art can understand that all or part of the operations in the method of the above embodiments can be completed by instructing the relevant hardware through a program. The program is stored in a storage medium, and includes several instructions to cause a device (which may be a single chip microcomputer, a chip, etc.) or a processor to execute all or part of the operations of the methods described in the various embodiments of the present application. The aforementioned storage medium includes: U disk, removable hard disk, Read-Only Memory (ROM), Random Access Memory (RAM), magnetic disk or optical disk and other media that can store program codes.

Those skilled in the art should understand that, all or some of the steps in the methods disclosed above, the functional modules/units in the system and the device can be implemented as software (which can be implemented with computer program code executable by the computing device), firmware, hardware and appropriate combinations thereof. In a hardware implementation, the division between functional modules/units mentioned in the above description does not necessarily correspond to the division of physical components. For example, one physical component may have multiple functions, or one function or step may be performed cooperatively by several physical components. Some or all physical components may be implemented as software executed by a processor, such as a central processing unit, digital signal processor or microprocessor, or as hardware, or as an integrated circuit, such as an application specific integrated circuit.

Those of ordinary skill in the art can understand that the above-mentioned embodiments are specific embodiments for realizing the present application. However, in practical application, various changes in form and details may be made therein without departing from the spirit and scope of the present application.

What is claimed is:

1. A signal distortion pre-correction method, comprising:
performing mutual coupling filtering processing on a forward signal of each digital channel according to a mutual coupling filter parameter, wherein the mutual coupling filter parameter is obtained by training a feedback signal collected by a multi-channel coupling element;
selecting a target predistortion coefficient from a predistortion coefficient candidate set according to a forward signal of a digital channel to be processed and the forward signal of each digital channel after the mutual coupling filtering, wherein the predistortion coefficient candidate set is obtained by training the feedback signal collected by the multi-channel coupling element; and
performing distortion pre-compensation processing on the forward signal of the digital channel to be processed according to the target predistortion coefficient.

2. The signal distortion pre-correction method of claim 1, wherein the predistortion coefficient candidate set comprises a two-dimensional look-up table, the two-dimensional look-up table is configured to store a relationship between a combination of a modulus value of the forward signal and a modulus value of the forward signal of each digital channel after mutual coupling filtering and a predistortion coefficient;
the selecting the target predistortion coefficient from the predistortion coefficient candidate set comprises:
searching for the two-dimensional look-up table according to the modulus value of the forward signal of the digital channel to be processed, and the modulus value of the forward signal of each digital channel after the mutual coupling filtering to obtain a corresponding predistortion coefficient, which is used as the target predistortion coefficient.

3. The signal distortion pre-correction method of claim 2, wherein the predistortion coefficient candidate set comprises a plurality of the two-dimensional look-up tables corresponding to different signal delays;
the searching for the two-dimensional look-up table comprises:
searching for each of the two-dimensional look-up tables, respectively, according to the modulus value of the forward signal of the digital channel to be processed, and the modulus value of the forward signal of each digital channel after the mutual coupling filtering to obtain predistortion coefficients corresponding to each of the two-dimensional look-up tables, which are respectively used as the target predistortion coefficients;
the performing the distortion pre-compensation processing on the forward signal of the digital channel to be processed according to the target predistortion coefficient comprises:
vector-multiplying the predistortion coefficients corresponding to each of the two-dimensional look-up tables with the forward signal of the digital channel to be processed, respectively, and adding multiplication results to obtain a pre-corrected forward signal.

4. The signal distortion pre-correction method of claim 1, wherein the performing the mutual coupling filtering processing on the forward signal of each digital channel according to the mutual coupling filter parameter comprises:
selecting the mutual coupling filter parameter of each digital channel in the mutual coupling filter parameter set obtained by training the feedback signal collected by the multi-channel coupling element according to a digital channel number and channel beam angle of each digital channel, wherein the mutual coupling filter parameter set comprises mutual coupling filter parameters corresponding to a combination of each digital channel number and each channel beam angle; and
performing the mutual coupling filtering process on the forward signal of each digital channel according to selected mutual coupling filter parameters of each digital channel.

5. The signal distortion pre-correction method of claim 1, wherein the predistortion coefficient candidate set being obtained by training the feedback signal collected by the multi-channel coupling element comprises:
constructing a signal matrix $W_j$ and a feedback signal matrix $V_j$ of the digital channel by using the forward signal of the digital channel and the feedback signal collected by the multi-channel coupling element according to distortion characteristic of power amplifier output signal of the digital channel, wherein the j represents a channel number of the digital channel;
obtaining the mutual coupling filter parameters and a power amplifier model coefficient $c_{PA}$ of the digital channel according to the $W_j$ and the $V_j$;
reconstructing a center signal of a far-field beam according to the mutual coupling filter parameters and the power amplifier model coefficient $c_{PA}$ of the digital channel; and obtaining the predistortion coefficient candidate set according to the forward signal of the digital channel, the reconstructed center signal of the far-field beam and a preset training model.

6. The signal distortion pre-correction method of claim 1, wherein the multi-channel coupling element is provided in a radome of a whole machine, or is provided on an antenna substrate at a near-field position outside the antenna.

7. The signal distortion pre-correction method of claim 1, wherein after performing the distortion pre-compensation processing on the forward signal of the digital channel to be processed according to the target predistortion coefficient, the signal distortion pre-correction method further comprises:
performing digital-to-analog conversion on the forward signal processed by the distortion pre-compensation to obtain an analog signal;
performing analog beamforming processing on the analog signal;
performing power amplifying processing on an output signal processed by the analog beamforming to generate a radio frequency signal that meets power requirements; and
sending the radio frequency signal through an antenna array.

8. A non-transitory storage medium for storing a computer-readable program, wherein the computer-readable program is used for a computer to execute the signal distortion pre-correction method of claim 1.

9. A signal distortion pre-correction device, comprising:
a coupling signal feedback control module, a predistortion learning module, a mutual coupling filter module and a predistortion module,
the coupling signal feedback control module is connected to the predistortion learning module, the predistortion learning module is respectively connected to the mutual coupling filter module and the predistortion module, and the mutual coupling filter module is connected to the predistortion module;
the coupling signal feedback control module is configured to obtain a feedback signal collected by a multi-channel coupling element, and transmit the feedback signal to the predistortion learning module;
the predistortion learning module is configured to obtain a mutual coupling filter parameter and a predistortion coefficient candidate set through training the feedback signal collected by the multi-channel coupling element, transmit the mutual coupling filter parameter to the mutual coupling filter module, and transmit the predistortion coefficient candidate set to the predistortion module;
the mutual coupling filter module is configured to perform mutual coupling filtering processing on a forward signal of a digital channel according to the mutual coupling filter parameter, and transmit the forward signal of the digital channel after the mutual coupling filtering to the predistortion module;
the predistortion module is configured to select a target predistortion coefficient from the predistortion coefficient candidate set according to the forward signal of the digital channel to be processed and the forward signal of the digital channel after the mutual coupling filtering, and perform distortion pre-compensation processing on the forward signal of the digital channel to be processed according to the target predistortion coefficient.

10. The signal distortion pre-correction device of claim 9, wherein the predistortion coefficient candidate set comprises a two-dimensional look-up table, the two-dimensional look-up table is configured to store a relationship between a combination of a modulus value of the forward signal and a modulus value of a forward signal of each digital channel after mutual coupling filtering and a predistortion coefficient;

the predistortion module is configured to search for the two-dimensional look-up table according to the modulus value of the forward signal of the digital channel to be processed, and the modulus value of the forward signal of each digital channel after the mutual coupling filtering to obtain a corresponding predistortion coefficient, which is used as the target predistortion coefficient, and is configured to perform the distortion pre-compensation processing on the forward signal of the digital channel to be processed according to the target predistortion coefficient.

\* \* \* \* \*